United States Patent [19]

Sauerwein et al.

[11] Patent Number: 5,526,286
[45] Date of Patent: Jun. 11, 1996

[54] OVERSAMPLED LOGIC ANALYZER

[75] Inventors: Tim E. Sauerwein, Portland; Craig L. Overhage; Donald C. Kirkpatrick, both of Beaverton, Oreg.

[73] Assignee: Tektronix, Inc., Wilsonville, Oreg.

[21] Appl. No.: 197,421

[22] Filed: Feb. 16, 1994

[51] Int. Cl.$^6$ ............................................. G01R 31/3177
[52] U.S. Cl. .............................. 364/550; 364/486
[58] Field of Search ........................... 371/6; 327/24, 327/27, 33, 57; 368/249, 251; 340/523, 527, 825.2; 324/620, 628, 76.58, 76.82; 364/4.86, 550

[56] References Cited

U.S. PATENT DOCUMENTS

| | | | |
|---|---|---|---|
| 4,107,651 | 8/1978 | Martin | 371/6 |
| 4,271,488 | 6/1981 | Saxe . | |
| 4,353,032 | 10/1982 | Taylor . | |
| 4,425,643 | 1/1984 | Chapman et al. . | |
| 4,481,647 | 11/1984 | Gombert et al. . | |
| 4,495,621 | 1/1985 | Nakagomi et al. | 371/6 |
| 4,558,422 | 12/1985 | DenBeste et al. . | |
| 4,578,666 | 3/1986 | Anderson . | |
| 4,646,297 | 2/1987 | Palmquist et al. . | |
| 4,731,768 | 3/1988 | Easterday . | |
| 4,777,616 | 10/1988 | Moore et al. . | |
| 4,903,240 | 2/1990 | Von Flue . | |
| 4,949,361 | 8/1990 | Jackson . | |
| 4,968,902 | 11/1990 | Jackson . | |
| 4,979,177 | 12/1990 | Jackson . | |
| 5,043,927 | 8/1991 | Jackson . | |
| 5,144,525 | 9/1992 | Saxe et al. . | |

OTHER PUBLICATIONS

"Oversampling Pushes Logic-Analyzer Resolution to New Highs", Jennie Grosslight, pp. 99–108, Electronic Design, Jun. 24, 1993.

"4–GSa/s Timing and 1–GSa/s Synchronous State for the HP 16500A/B Logic Analysis System", Hewlett–Packard Marketing Material.

The HP 16517/18A Supplemental Specifications and Characteristics, Hewlett–Packard Specification Sheet.

Primary Examiner—Emanuel T. Voeltz
Assistant Examiner—Thomas Peeso
Attorney, Agent, or Firm—Boulden G. Griffith

[57] ABSTRACT

A logic analyzer acquires all data and clock signal inputs asynchronously at high speed using a digital FISO (10) to produce a plurality of parallel high-speed data samples within each cycle of an internal system clock (95). The plurality of parallel high-speed data samples describe the sequential behavior of one of the input signals during one period of the internal system clock. One of the plurality of parallel high-speed data samples is then selected to be the single data sample that is stored in the acquisition memory (80) for that clock cycle. The selection process includes a skew adjustment (20), clock edge detection and selection (50), aligning the sample associated with the detected and selected clock edge to a reference location (60), and selecting (70) as the single sample to be stored a sample having a relationship to the reference location that is determined by setup and hold adjustment data. The transitions detected are enabled (102) and ORed (108) to produce a setup and hold violation signal only if they are within the interval established by a set of setup and hold window mask signals.

17 Claims, 5 Drawing Sheets

OVERSAMPLED LOGIC ANALYZER

FIELD OF THE INVENTION

This invention relates to that class of digital data acquisition instruments known as logic analyzers, and more particularly to a new approach to logic analyzer design that employs asynchronous oversampling of the input signals to achieve a number of novel capabilities.

BACKGROUND OF THE INVENTION

Logic analyzers are digital data acquisition instruments that allow a user to acquire and analyze digital data from a large number of logic signals, such as all of the address, data, and control signals associated with a microprocessor. Each logic signal is compared to a logic threshold or thresholds and resolved into one of two logic states, high or low, one or zero, true or false. The behavior of groups of these signals can then be monitored to analyze the behavior of the circuitry under test.

The time at which the state of the logic signals under analysis is resolved into binary form is determined by a clock signal. If this clock signal is generated by the logic analyzer and is independent of the system under test, the acquisition is said to be "asynchronous". If the clock signal is derived from the system under test so as to bear a predetermined timing relationship to part of the activity within that system, the acquisition is said to be "synchronous". Data that is originally synchronous to the user's system clock must be resynchronized to the internal clock of the logic analyzer for further processing. U.S. Pat. No. 4,949,361 to Jackson for "Digital Data Transfer Synchronization Circuit and Method" hereby incorporated by reference, describes circuitry for accomplishing this task very efficiently.

Typically, asynchronous data acquisition is relatively rapid and is used for analyzing the "timing" of circuit hardware. And, synchronous data acquisition is typically relatively slower and is used for analyzing the "state" of the system during software execution. U.S. Pat. No. 4,425,643 to Chapman et al. for a "Multi-Speed Logic Analyzer", hereby incorporated by reference, describes a logic analyzer with two sections capable of operating in conjunction with two different clocks. This type of architecture permits coordinated state and timing analysis.

Once data is acquired from two different clock signals (also know as "timebases") that are asynchronous to each other and therefore "unrelated", methods must be found to make their relative timing relationships available to the operator of the logic analyzer. U.S. Pat. No. 4,558,422 to DenBeste et al. for a "Digital Signal Sampling System with Two Unrelated Sampling Timebases", and U.S. Pat. No. 4,578,666 to Anderson for a "Method of Comparing Data with Asynchronous Timebases", both hereby incorporated by reference, both describe ways of handling data so that an accurate display of timing relationships is presented to the operator.

Another approach to keeping track of the sampling time associated with different events is the use of "timestamps". Timestamps are a count that is stored when each sample is acquired, and which can then later be used for a variety of purposes. U.S. Pat. No. 4,731,768 to Easterday for "Autoranging Time Stamp Circuit", hereby incorporated by reference, describes one approach to timestamp generation.

The data in the system under analysis may suffer from a variety of defects that distinguish it from theoretically ideal digital data, i.e., data that goes from one stable and well defined logic state to another in an appropriate transition. Data may contain "glitches", or be unstable in some other way, or the data transition may suffer from slow rise or fall times, or exhibit other less-than-ideal behaviors. U.S. Pat. No. 4,353,032 to Taylor for "Glitch Detector", hereby incorporated by reference, describes glitches and a circuit for capturing information about them. U.S. Pat. No. 4,968,902 to Jackson for "Unstable Data Recognition Circuit for Dual Threshold Synchronous Data", hereby incorporated by reference, describes circuitry for detecting when one or more signals under analysis are not behaving properly. And, U.S. Pat. No. 5,043,927 which is also to Jackson for "Digital Signal Quality Analysis Using Simultaneous Dual-Threshold Data Acquisition", hereby incorporated by reference, describes a method for finding a variety of signal anomalies in a repetitive signal using dual thresholds in a succession of measurements.

Since logic analyzers acquire signals across a large number of channels simultaneously, and the signal paths through the input circuitry of the logic analyzer or the probes used to connect to the user's system may not be all exactly equivalent electrically, the propagation times of signals passing through these different paths may not be all the same. When this occurs, one signal is said to exhibit "skew" in relation to a another signal. U.S. Pat. No. 4,646,297 to Palmquist et al. for "Skew Detector", hereby incorporated by reference, describes a circuit for detecting this condition. U.S. Pat. No. 4,481,647 to Gombert et al. for "Method and Apparatus of Compensating for Variations in Signal Propagation Time Existing Within the Channels of a Multi-Channel Device", hereby incorporated by reference, describes means for correcting skew errors.

The "resolution" of a logic analyzer is typically the same as the acquisition clock period, e.g., 10 ns for a 100 MHz clock. U.S. Pat. No. 4,979,177 to Jackson for "Enhanced Counter/Timer Resolution in a Logic Analyzer", hereby incorporated by reference, describes a logic analyzer with the ability to use two phases of the system clock to acquire data and then maintain the resulting improved resolution as the data is manipulated internally using a single phase clock. The result is an effectively doubled resolution, e.g., 5 ns for a 100 MHz clock. Another approach is described in U.S. Pat. No. 4,777,616 to Moore et al. for "Increased Resolution Logic Analyzer Using Asynchronous Sampling", hereby incorporated by reference. This approach relies on repeatedly sampling a repetitive signal asynchronously to increase the effective resolution.

Obviously, the most straightforward way to increase resolution is to increase the frequency of the acquisition clock signal itself. One of the obstacles that is encountered with this approach is the speed limitations of the acquisition memory. U.S. Pat. No. 4,903,240 to Von Flue for "Readout Circuit and Method for Multiphase Memory Array", hereby incorporated by reference, describes a scheme for demultiplexing the input signal data into an array of memories and circuitry for reading out the contents of those memories.

The fast acquisition of data is even more challenging when the analog level of the input signal must be determined, rather than just its relationship to a logic level threshold. This challenge is always present in high speed analog oscilloscopes such as the one whose front end is described in U.S. Pat. No. 5,144,525 to Saxe et al. for "Analog Acquisition System Including a High Speed Timing Generator", hereby incorporated by reference. Another high speed, fast-in slow-out (FISO) acquisition system is described in U.S. Pat. No. 4,271,488 to Saxe for a "High-Speed Acquisition System Employing an Analog Memory Matrix", hereby incorporated by reference.

In U.S. Pat. No. 5,144,525 each cell in the array is selected sequentially for sampling at a very rapid rate. Rows within this array of cells are selected by slow timing signals generated by a slow shift register, while individual cells within each row are selected by fast sample and hold signals, generated in a variety of alternative ways.

A variety of the methods for generating rapidly occurring hold signals that are discussed in the U.S. Pat. No. 5,144,525 patent. However, even the fastest and most adjustable of these methods have limitations in their speed and adjustability. Co-pending U.S. patent application Ser. No. 07/824,434 (assignee docket number USA 5429) to Kogan for "High Speed Sample and Hold Signal Generator", hereby incorporated by reference, provides an improved sample and hold signal generator with very short delay intervals between successive sample-to-hold signal transitions and adjustability in both the timing of individual transitions relative to a reference timing signal and in the collective delay of a whole row of fast timing signals.

All synchronous digital circuitry requires a certain degree of stability of its inputs in order to guarantee appropriate and reliable behavior of its outputs. The time that inputs must be stable before a synchronizing event in order to assure proper operation is known as "setup time", while the time that inputs must be stable after the synchronizing event to assure proper operation is known as "hold time". A logic analyzer also has setup and hold times of its own. Normally, the setup time of a logic analyzer is as short as possible and its hold time is zero. Ideally, this setup and hold time "window" would be adjustable so that it could be positioned as the user desires.

A conventional logic analyzer typically does some processing of a user's clock signal before using it to acquire synchronous data. Since this processing takes some time, the data signals that are to be clocked also must be delayed in order to position the setup and hold time window where it belongs, Putting delay lines on every channel adds a lot to the price of a logic analyzer. Moreover, equalizing the resulting delays can add additional expense and complexity. If every delay line is adjustable, channel-to-channel skew can be minimized and the setup and hold window can be minimized, and even moved relative to the acquisition clock signal. However, putting adjustable delay lines on every channel is quite expensive. Nonetheless, this is the approach that has frequently been employed to make a logic analyzer with suitable specifications. Since the setup and hold time for a group of channels is only as good as the worst of those channels, channel-to-channel skew degrades the logic analyzer's overall setup and hold time performance as well as having a variety of other detrimental effects.

Recently, at least one manufacturer of logic analyzers (Hewlett-Packard) has adopted synchronous oversampling of input signals in one of its logic analyzers, the HP 16517A. (It is believed that this approach was first developed by Outlook Technology, now part of Biomation, in the early 1980's.) In this approach a user's clock signal is used to control a phase lock loop (PLL) that is tuned to produce an acquisition clock signal at a frequency that is a multiple of the user's clock frequency. This approach allows a better view of fine timing differences between channels, but it suffers from several major limitations relative to the present invention. Because of the use of PLL, the user's clock signal must be periodic and above a minimum frequency, and the logic analyzer that uses it must be implemented in a high-speed, higher-cost, lower-density technology to support that speed. Any jitter in the user's clock signal causes sampling errors in the data acquired. And, because the logic analyzer's internal synchronization is also controlled by the user's clock, any time measurements must be indirect, i.e., the product of a clock count and a measured average period of the user's clock signal.

SUMMARY OF THE INVENTION

It is an object of the present invention to provide a logic analyzer with small and adjustable setup and hold time requirements.

It is a further object of the present invention to provide a logic analyzer capable of detecting setup and hold violations with unprecedented resolution.

It is a further object of the present invention to provide a logic analyzer in which channel-to-channel skew adjustments can be readily accomplished in a way that does not require delay lines for each data input channel.

It is a further object of the present invention to provide a logic analyzer with extremely accurate timestamping of acquired data.

It is a further object of the present invention to provide a logic analyzer which can acquire the same signals both synchronously and asynchronously simultaneously without double probing.

It is also an object of the present invention to provide a logic analyzer with enhanced glitch detection employing digital rather than analog circuitry.

Accordingly, the present invention provides a logic analyzer in which all data and clock signal inputs are acquired asynchronously at high speed by a digital FISO to produce a plurality of parallel high-speed data samples within each cycle of an internal system clock. The plurality of parallel high-speed data samples describe the sequential behavior of one of the input signals during one period of the internal system clock. One of the plurality of parallel high-speed data samples is then selected to be the single data sample that is stored in the acquisition memory for each valid synchronous clock cycle, or every clock cycle during asynchronous acquisitions. The selection process includes a skew adjustment, clock edge detection and selection, aligning the sample associated with the detected and selected clock edge to a reference location, and selecting as the single sample to be stored a sample having a relationship to the reference location that is determined by setup and hold adjustment data.

According to another aspect of the invention, a completely digital and synchronous glitch detector monitors the parallel high-speed data samples after they are skew adjusted and after thay have been referenced to a user's clock edge, and from these samples generates a glitch signal when glitches have occurred.

According to another aspect of the invention, a setup and hold violation checker detects transitions in the input signal from the parallel high-speed data samples after they are skew adjusted and associated with a clock edge. The transitions detected are enabled and ORed to produce a setup and hold violation signal only if they are within the interval established by a set of setup and hold window mask signals.

It is a feature of the invention that the timing between different data channels can be adjusted during the selection process to minimize channel-to-channel skew and minimize the logic analyzer's intrinsic setup and hold times.

It is also a feature of the invention that the timing between a clock channel and data channels can be adjusted during the selection process to allow the effective setup and hold times of the acquisition to be varied and for setup and hold violations to be detected with unprecedented resolution.

It is also a feature of the invention that "fine" timestamps can be associated with data samples during the selection process so that skew adjusted data bears highly accurate timestamp information.

It is also a feature of the invention that glitches can be detected with enhanced resolution digitally because of the extra sampling that occurs before the selection of the single bit to be stored.

It is a further feature of the invention that the foregoing advantages can be achieved with a timing resolution that well exceeds the intrinsic speed of the underlying technology, thereby producing enhanced performance or reduced costs or some combination thereof, depending on the tradeoffs made.

DETAILED DESCRIPTION OF THE INVENTION

Figure 1:
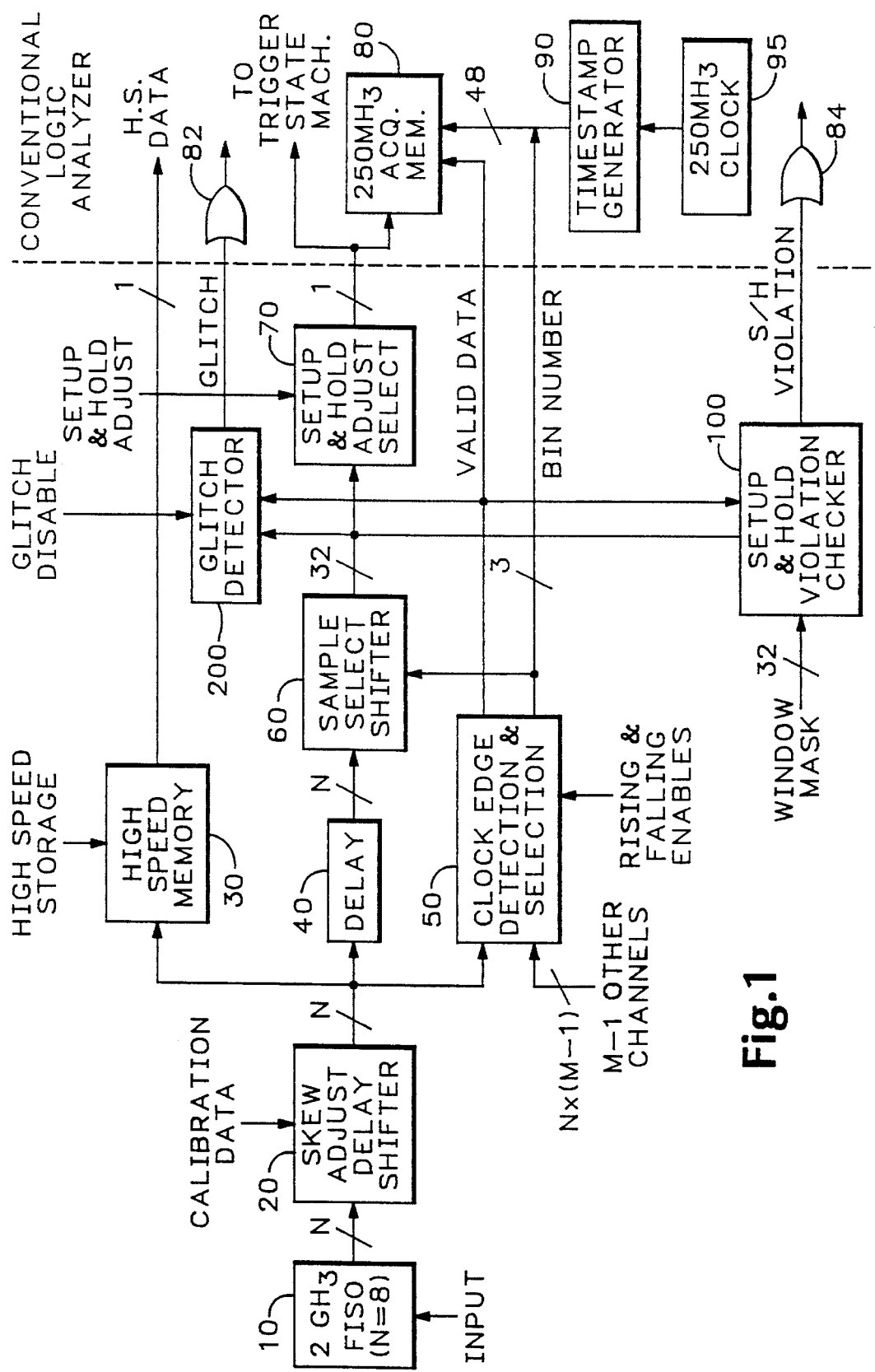
FIG. 1 is a block diagram of logic analyzer front-end circuitry used to implement one embodiment of the invention.

Referring to FIG. 1, each channel of logic analyzer input, including both data signals and clock signals, is processed by circuitry such as that shown in this Figure. All of the circuitry shown in FIG. 1 operates synchronously in response to system clock signals received from the 250 MHz clock 95 shown at the lower right. Clock signal connections are omitted for clarity. The circuitry to the right of the vertical dashed line, such as the timestamp generator 90, is part of the prior art available in conventional logic analyzers. Also part of the conventional logic analyzer, but not shown in FIG. 1, is a trigger state machine, which monitors the incoming data to the conventional part of the logic analyzer and controls data storage and various other operations.

A fast-in, slow-out (FISO) acquisition circuit 10 closely resembles that described in the U.S. Pat. No. 5,144,525 patent discussed and incorporated by reference above. The modified FISO 10 shown here contains flip-flops as digital storage elements, rather than the analog storage cells described in the U.S. Pat. No. '525 patent. It acquires samples at a 2 GHz rate, which is eight times faster than the internal clock rate of the logic analyzer containing the first embodiment of this invention. The internal clock of this logic analyzer runs at 250 MHz. Thus, the FISO samples according to an oversampling factor M having a value of 8 in the particular implementation shown.

The output of the FISO 10 is 8 bits of parallel high-speed data samples synchronized to the 250 MHz internal clock. This 8-bit parallel high-speed sample is applied to the input of skew adjustment delay shifter 20. The shifter 20 holds three sequential sets of the 8-bit samples at a time, and produces an 8-bit output of consecutive bits starting from a location determined by a CALIBRATION DATA input, which functions like a pointer. The eight consecutive bits in the output can start anywhere within the 24 bits held by the shifter, so that the function performed is to shift the time reference of the data stream by shifting the boundaries of the 8-bit blocks of bits.

The shifting performed by the skew adjust delay shifter 20 aligns each channel of data to a common time reference to compensate for channel-to-channel skew in the propagation delays from the probe tip to the FISO 10. Thus, the output of this circuit is time-aligned parallel high-speed data that is eight bits wide. For other oversampling factors N this parallel data would be N-bits wide.

Internally, the skew adjustment delay shifter 20 contains a number of N-wide registers that shift the incoming data along in N-bit groups while maintaining the original time-based sequence. In addition to being supplied to the next internal N-bit register, the outputs of these registers are all arranged to form one long serial register from which an N-bit wide group of bits starting at any arbitrary location may be selected as the final N-bit parallel output of the skew adjustment delay shifter 20, the time-aligned parallel high-speed data.

The gating that produces the N-bit wide group of bits starting at any arbitrary location can be implemented by using N S-to-1 multiplexers, where S is the total number of bits available for shifting. Each multiplexer has its inputs offset by one additional location for each position that they occupy in the output. Thus, when the CALIBRATION DATA signals are applied to the select inputs of these S-to-1 multiplexers, their overall binary value determines which contiguous N bits are available on their outputs.

The N-wide time-aligned parallel high-speed data signals from the skew adjustment delay shifter 20 are input to three circuits, the high speed memory 30, the digital delay element 40, and the clock edge detection and selection circuitry 50. The digital delay element 40 matches the delay required by the clock edge detection and selection block 50 to compute the BIN NUMBER.

The high speed memory 30 continuously records into a circular buffer the most recent few hundred or thousand N-bit wide groups of time-aligned parallel high-speed data signals. Upon the receipt of the HIGH SPEED STORAGE signal, the high speed memory 30 ceases overwriting the contents of its circular buffer and thereby preserves those contents.

Figure 2:
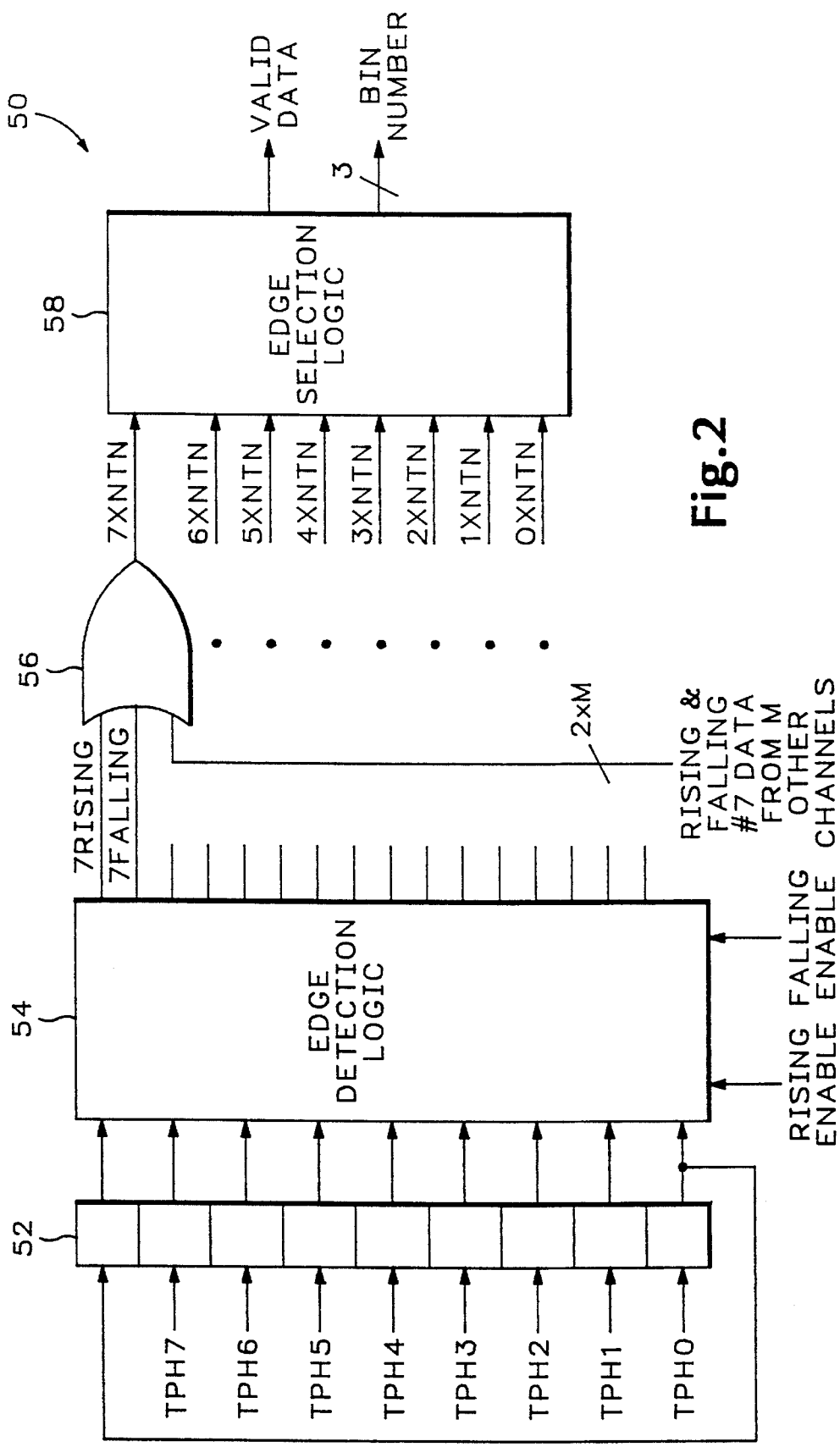
FIG. 2 is a simplified block diagram of the clock edge detection circuitry block 50 shown in FIG. 1.

The clock edge detection and selection circuitry 50 determines from the user's selection of RISING & FALLING ENABLE signals, and from the N-bit wide time-aligned parallel high-speed data signals associated with a number M-1 of other channels, M-1 OTHER CHANNELS, and the present channel, a BIN NUMBER. FIG. 2 is a simplified block diagram of clock edge detection circuitry block 50 shown in FIG. 1.

Referring now to FIG. 2, the 8-bit wide time-aligned parallel high-speed data signals, TPH0 through TPH7, are stored in register 52. "TPH" stands for "time-aligned parallel high-speed". Register 52 presents these signals to edge detection logic 54, which also receives RISING ENABLE and FALLING ENABLE signals. The user chooses input channels and the type of transitions (rising or falling) on those channels that the logic analyzer is use as a synchronous clock input, and the logic analyzer microprocessor (not shown) supplies the appropriate channel's clock edge detection and selection circuitry 50 with corresponding RISING ENABLE and FALLING ENABLE signals. Edge detection logic 54 has sixteen outputs, an XRISING and an XFALLING signal corresponding to each of the time-aligned parallel high-speed data signal inputs supplied by register 52.

Each pair of XRISING and XFALLING signals is monitored by an OR gate, such as OR gate 56, which monitors the 7RISING and 7FALLING signals. Each of these OR gates also receives the XRISING and XFALLING signals from M-1 OTHER CHANNELS, and produces a high output channel transition signal whenever either type of transition, rising or falling, occurs on any of the M channels being monitored. These channel transition signals, 7XNTN through 0XNTN, are the inputs to edge selection logic block 58.

Edge selection logic 58 produces an active VALID DATA signal whenever any of its inputs are active. It also calculates a BIN NUMBER output based on its inputs according the following algorithm: identify as an active clock edge the first transition that occurs equal to or greater than 4 ns (8 samples) from the last transition identified. In the presently described implementation, TPH0 represents the first occurring data, while TPH7 represents that which occurred last.) The effect of this algorithm is to produce only one BIN NUMBER value per system clock interval, and to have that number describe a location in time that is at least one full clock period after the time described by the preceding BIN NUMBER. Thus, the BIN NUMBER serves as the least significant bits of a larger timestamp value, for which it provides significantly enhanced time resolution. Except for the addition of these three extra least significant bits, the timestamping used with this invention is the same as that used in prior art logic analyers.

Figure 3:
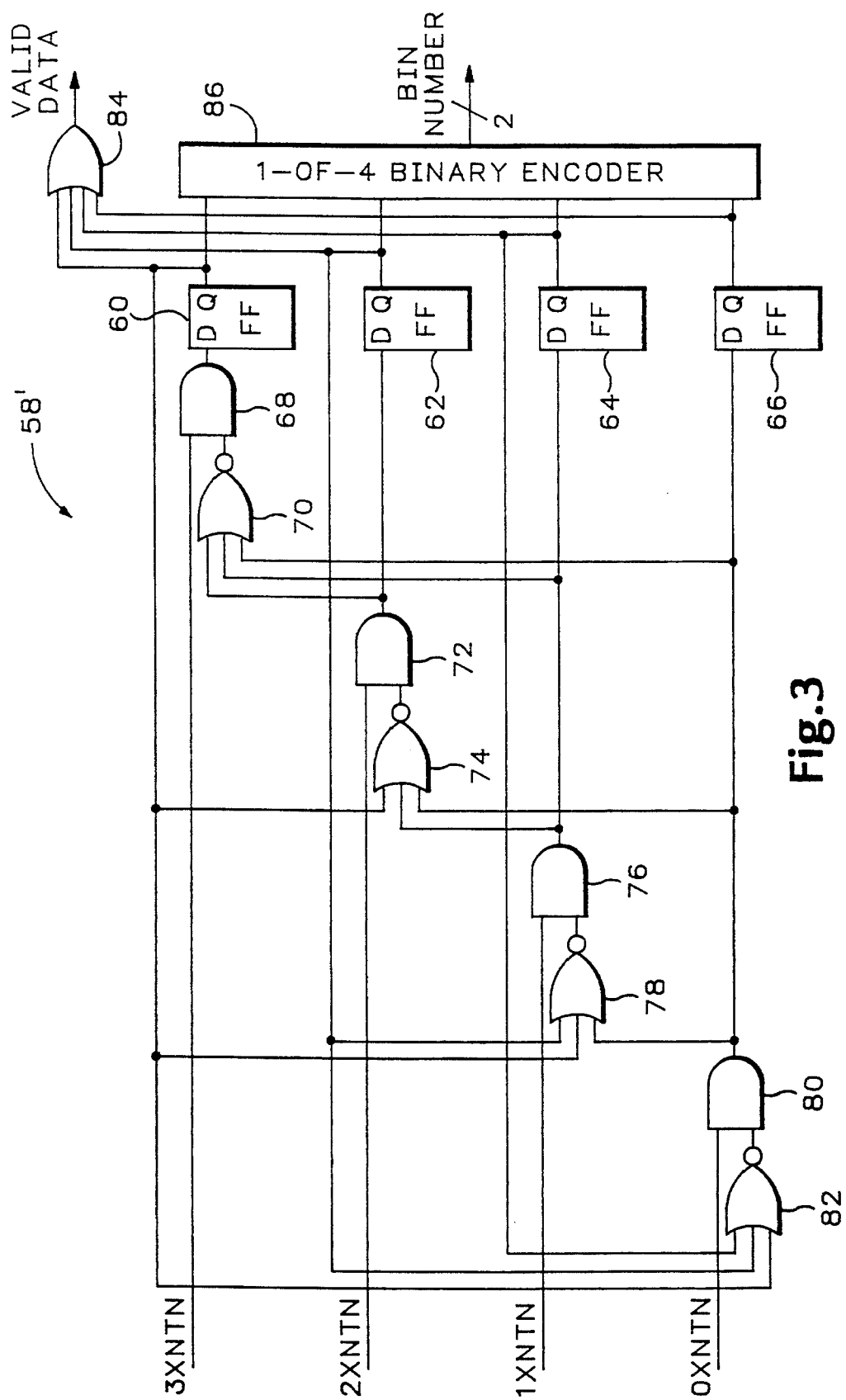
FIG. 3 is a schematic diagram of a simplified version of the edge selection logic block 58 shown in FIG. 2.

Refer next to FIG. 3, which is a schematic diagram of a simplified version 58' of the edge selection logic of block 58 in FIG. 2. For ease of illustration of the principles involved, the edge selection logic 58' shown in FIG. 3 has been simplified to only handle four input signals, 0XNTN through 3XNTN, rather than the full eight required by the context shown in FIG. 2. The flip-flops 60, 62, 64, and 66 hold each state of the outputs of AND gates 68, 72, 76, and 80, respectively, for one system clock period so that previous state information can be used to determine the present outputs of the AND gates 68, 72, 76, and 80. This is necessary to allow edges detected during the previous state to disable edges in the present state that occur at a location that represents a time that is within one system clock period of the preceding edge.

Let us assume for illustration that flip-flop 62 is set and that the other flip-flops 60, 64, and 66 are reset, indicating that during the time interval represented by the data handled during the last clock period a valid edge was found to be associated with high input on 2XNTN. Let us also assume for the sake of this illustration that 1XNTN and 3XNTN are high, indicating that during the present clock period there were logic transitions associated with the second and fourth time sub-intervals. 0XNTN and 2XNTN are assumed to be low at this time, and therefore AND gates 80 and 72 are disabled. The high signals 1XNTN and 3XNTN enable AND gates 76 and 68, so that their outputs are determined by their other inputs, from NOR gates 78 and 70, respectively.

Under the stated conditions, NOR gate 78 is receiving a high input from the Q output of flip-flop 62 and the resulting low output of NOR gate 78 disables AND gate 76. This is the desired result according to the algorithm stated above, i.e., one full clock period minimum separation between the active edges selected. The inputs to NOR gate 70 are all low, since AND gates 80 and 72 are disabled by the lows on 0XNTN and 2XNTN, respectively, and AND gate 76 is disabled by the low output of NOR gate 78. Therefore, the output of NOR gate 70 is high and the output of AND gate 68 is high. This is also the desired outcome, since our algorithm requires us to select the first active edge indication that occurs at least one full system clock period after a preceding one. Thus, on the next system clock edge, flip-flop 60 will go set and the other flip-flops 60, 64, and 66 will all be or remain reset. The output of the 1-of-4 binary encoder 86 will change from a "10" which was its state when flip-flop 62 was set, to a "11", which is the code for when flip-flop 60 is producing the only active (high) input. The VALID DATA output of OR gate 84 is high whenever any of the flip-flops 60, 62, 64, or 66 are set, so this signal remains high throughout both system clock intervals in this example.

Note how the outcome of the preceding illustration is altered if the initial state of all of the flip-flops is low, indicating that no user clock edges of interest were detected during the previous system clock interval. With none of the flip-flops 60, 62, 64, or 66 set, VALID DATA is low and the BIN NUMBER output of the 1-of-4 binary encoder is "00". The absence of a high input to NOR gate 78 causes its output to be high, enabling AND gate 76 and causing its output to go high in response to the high on the 1XNTN input. The high output of AND gate 76 causes a low on the output of NOR gate 70, and thereby disables AND gate 68. Thus, on the next system clock edge, flip-flop 64 is the only flip-flop set and the output of the 1-of-4 binary encoder goes to "01" (instead of the "11" code reached at this point in time when we started with flip-flop 62 set). Thus, when the output associated with location "01" is not blocked by activity during the previous cycle, it becomes the active output and blocks the generation of an "11" output.

While FIG. 3 shows a four bit wide version 58' of the edge selection logic 58 shown in FIG. 2, an eight bit wide version follows the same implementation principles. In the eight bit version of this circuit each of the NOR gates 70, 74, 78, and 82 has four additional inputs, as does the OR gate 84 and the 1-of-4 binary encoder 86. In the eight bit version there are four more input signals, 4XNTN through 7XNTN, and four more sets of NOR gates, AND gates, and flip-flops associated with them. As in the version actually shown, the NOR gate 82 associated with the most recent input (0XNTN) receives all of its inputs from the outputs of the flip-flops. Also, the NOR gate associated with the most remote in time input (7XNTN) derives all of its inputs from the outputs of the AND gates associated with nearer-in-time information. And, as in the version shown, NOR gates associated with bits in-between have mixed inputs, with more inputs being from the current data and fewer inputs from the previous data, as the signal location it is associated with becomes less current. In the eight bit version of this circuit the 1-of-4 binary encoder has three output bits, the number needed to encode the contents of eight input lines.

Referring again to FIG. 1, the VALID DATA signal informs the glitch detector 200, the 250 MHz Acquisition Memory 80, and the setup and hold violation checker 100 when there is an occurrence of a user clock edge within the time interval of a particular set of 32-bit data coming out of the sample select shifter 60. The VALID DATA signal may require various amounts of delay to properly achieve this function at different locations. For instance, the 250 MHz acquisition memory receives its input after the delay of the setup and hold adjust select circuitry, so it should delay the VALID DATA signal by that same amount.

The BIN NUMBER output of the clock edge detection and selection circuitry 50 is supplied as a control input to the sample select shifter 60. The sample select shifter 60 operates in the same manner as the skew adjust delay shifter 20, except that it produces a 32-bit output. This output has been shifted so that the sample identified by the BIN NUMBER, the reference bit, is always in a known location, typically centered. This reference bit is the first one that was sampled after a transition of user's clock as reconstituted by the clock edge detection and selection circuitry 50. The other 31 bits are the data occurring before and after the transition of the user's clock. These other bits maintain their sequence and time relationship to the reference bit.

The 32-bit output of the sample select shifter 60, with its centered reference bit, is the input to glitch detector 200, setup and hold violation checker 100, and to setup and hold adjust select circuitry 70. Setup and hold adjust select circuitry 70 produces as its single output bit a bit bearing a relationship to the "golden" bit that is determined by the content of the SETUP & HOLD ADJUST signal. (While only a single bit is produced here, more could readily be produced in accordance with the same principles of operation.) For the implementation shown, with 16 bits available in each direction and 500 ps per sample, the selected bit may represent the value of the input signal as it occurred up to 8 ns either forward or backward in time. The select bit (or bits) is then stored in the 250 Mhz Acquisition Memory 80 if the VALID DATA signal is active. In an alternative embodiment, all of the data is stored, but marked according the content of the VALID DATA signal.

Figure 4:
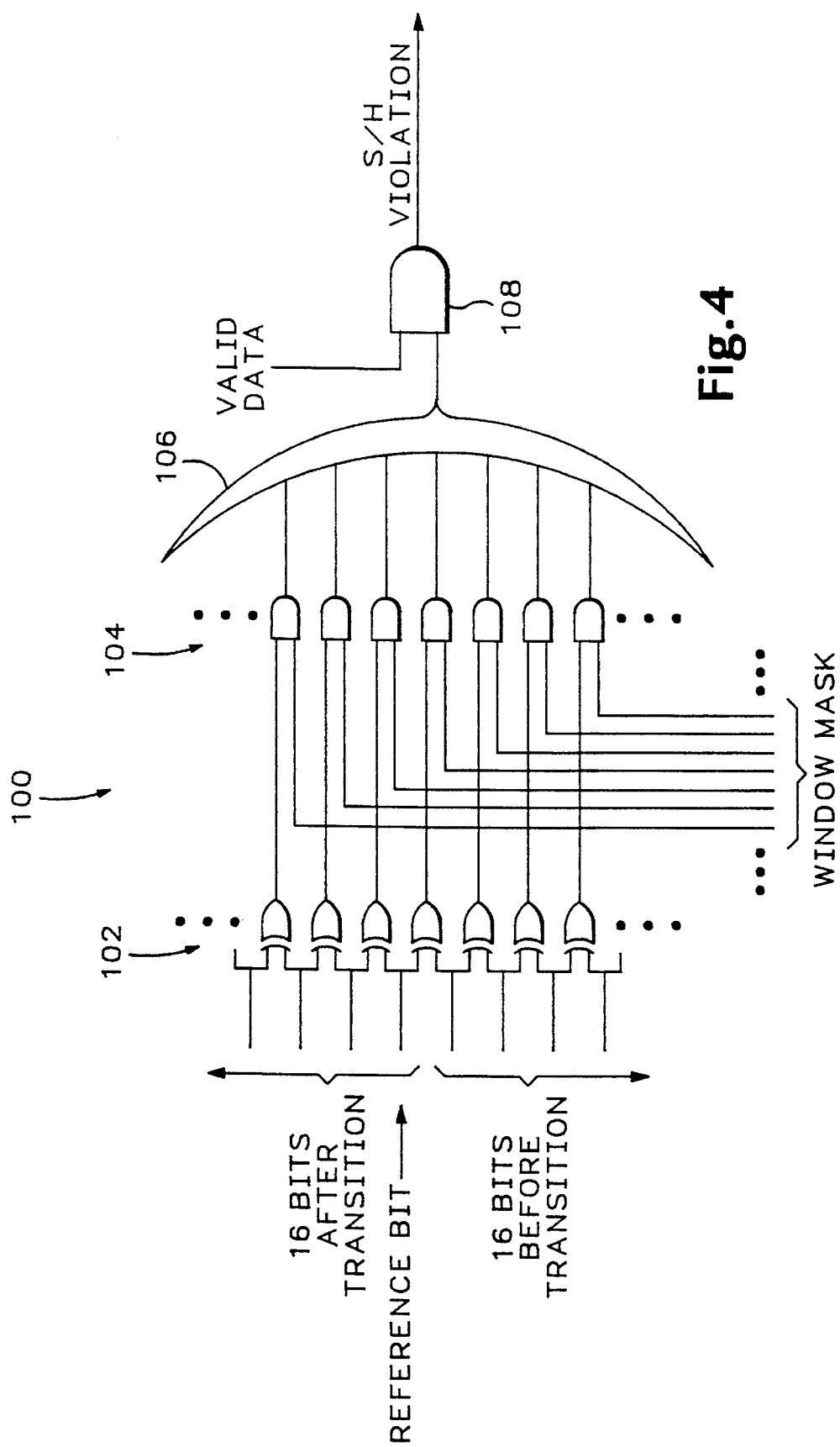
FIG. 4 is a partial schematic diagram of the setup and hold violation checker 100 shown in FIG. 1.

Refer next to FIG. 4, which shows a partial schematic diagram of the setup and hold violation checker 100 shown in FIG. 1. The 32-bit input to the setup and hold violation checker 100 consists of 16 bits occurring before the user's clock signal made a transition and the 16 bits occurring after that transition. The reference or "golden" bit is the first bit occurring after the transition.

Exclusive-OR (XOR) gates 102 monitor each adjacent pair of input signals and produce an active output when these two signals are not in the same state. Thus, if the state of the input signal changed during the 16 ns interval whose samples are represented by the 32-bit input, at least one of the XOR gates 102 will produce an active (high) output.

AND gates 104 are partially enabled by WINDOW MASK signals that generally have the pattern: . . . 00011111000 . . . , a pattern that defines a setup and hold time window. Note that this window does not necessarily have to include the reference bit; i.e., negative setup and hold times can be defined by this window. OR gate 106 produces an active output whenever a transition, as detected by XOR gates 102, passes through enabled AND gates 104. If the VALID DATA signal is active and enabling AND gate 108, the output of OR gate 106 is presented to the rest of the circuitry as an active S/H VIOLATION signal by AND gate 108.

The S/H VIOLATION signal is an input to OR gate 84 in the conventional logic analyzer shown at the right of FIG. 1. OR gate also receives similar S/H VIOLATION signals (not shown) from other channels, and combines these into a setup and hold violation signal across a group of channels of interest to the operator.

Figure 5:
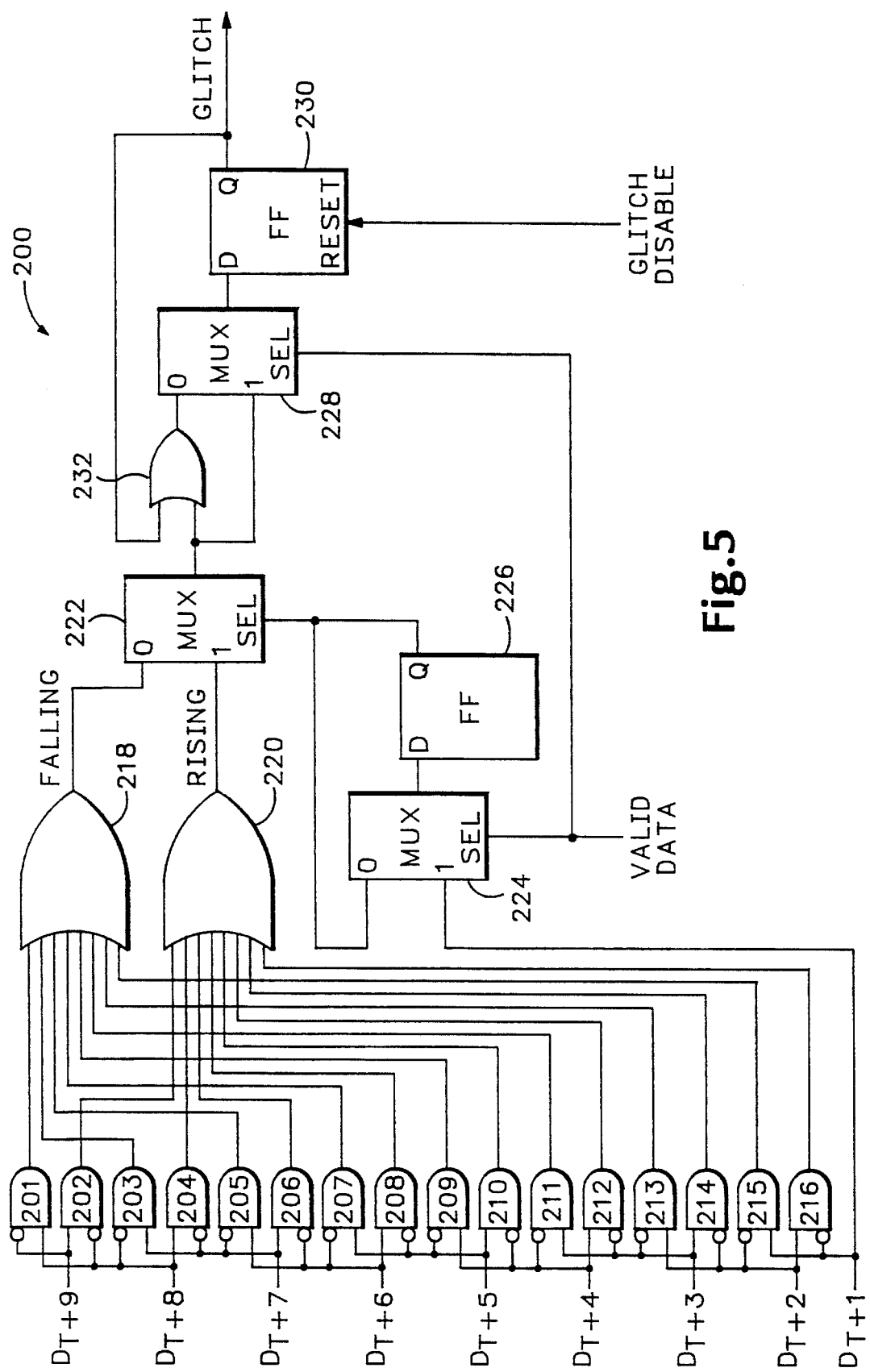
FIG. 5 is a schematic diagram of the glitch detector 200 shown in FIG. 1.

Refer now to FIG. 5, where a schematic diagram of the glitch detector 200 of FIG. 1 is shown. The inputs to this circuit are the first nine bits occurring after the user's clock transition, $D_{T+1}$ to $D_{T+9}$. $D_{T+1}$ is the reference or "golden" bit. AND gates 201–216 with one inverted input form two banks of edge detectors, each looking for transitions of opposite polarity on the input signals. The outputs of the bank of AND gates looking for falling edges are all connected to the inputs of OR gate 218. The outputs of the bank of AND gates looking for rising transitions are all connected to the inputs of OR gate 220.

When VALID DATA is active, multiplexer 224 has its "1" input selected for output. The "1" input to multiplexer 224 is the "golden" or reference bit $D_{T+1}$. Thus, on the occurrence of each system clock, flip-flop 226 assumes the state of the reference bit. The output of flip-flop 226 is coupled to the select input of multiplexer 222 and to the "0" input to multiplexer 224. Since multiplexer 224 has its "0" input selected for output when VALID DATA is low, when VALID DATA is low the input to flip-flop 226 is its own output and flip-flop 226 retains the state of its input at the last time VALID DATA was active-high.

Let us assume for the sake of illustration that on the edge of the last system clock flip-flop 226 was set high by a high reference bit and an active VALID DATA signal and that the present inputs to $D_{T+1}$ through $D_{T+9}$ are all high, indicating that the input signal remained continuously high during the interval that this data represents, i.e., no glitch was present during this interval. Under these conditions, none of the AND gates 210–216 produce an active output, and therefore neither OR gate 218 or 220 produce an active output, and it doesn't matter which input to multiplexer 222 is selected by the output of flip-flop 226, since its output will be low (inactive) in either case. A low output from multiplexer 222 puts a low on the "1" of multiplexer 228. If we assume that VALID DATA is still high, this low is the selected output to the "D" input of flip-flop 230 and that flip-flop 230 will produce a low output on the next system clock pulse, unless it is reset by the GLITCH DISABLE signal connected to its reset input.

Let us next assume that during the following system clock interval, the $D_{T+9}$ to $D_{T+1}$ inputs all remain high except that $D_{T+5}$ goes low, indicating that about half way through the 4 ns interval covered by these inputs a glitch having a width less than 1 ns occurred. The low on $D_{T+5}$, in conjunction with the highs on $D_{T+4}$ and $D_{T+6}$, causes the outputs of AND gates 209 and 208 to go high. A high output from AND gate 209 causes a high FALLING output from OR gate 218. A high output from AND gate 208 causes a high RISING output from OR gate 220. Because both input to multiplexer 222 are high, a high signal is now applied to the "1" input of multiplexer 228, regardless of the state of flip-flop 226 and the selection made by multiplexer 222. For the example, we will assume that VALID DATA has remained high and that therefore multiplexer 228 has its "1" input selected. Therefore, the signal on the "D" input to flip-flop 230 is high and its output, the GLITCH signal, will be high after the next system clock signal, assuming that GLITCH DISABLE remains in its normal low state.

When VALID DATA goes low, indicating the absence of a user clock during the current 4 ns interval, the "0" inputs of both multiplexers 224 and 228 are selected. With the "0" inputs to these multiplexers 224 and 228 selected, the outputs of flip-flops 226 and 230 are connected to their inputs, so that they will be able to maintain the state that they were in during the time that VALID DATA is inactive (low). In the case of flip-flop 230, the output of flip-flop 230 is ORed with the output of multiplexer 222 before it reaches the "0" input of multiplexer 228. This permits an inactive (low) GLITCH signal to be changed to its active state by a high on FALLING or RISING, but an active state of GLITCH is maintained once flip-flop 230 has been set without regard to changes in the state of FALLING or RISING.

The output of flip-flop 226 reflects the state of $D_{T+1}$ during the preceding 4 ns interval. If the output of flip-flop 226 is high, multiplexer 222 applies the RISING signal to the OR gate 232 and the "1" input of multiplexer 228. If the output of flip-flop 226 is low, multiplexer 222 applies the FALLING signal to OR gate 232 and the "1" input of the multiplexer 222. Thus, when $D_{T+1}$ was previously high, a rising edge during the present 4 ns interval produces a GLITCH output, whereas when $D_{T+1}$ was previously low, a falling edge during the present 4 ns interval produces the GLITCH output.

Referring again to FIG. 1, some design alternatives are worthy of further discussion. The sample selection shifter 60 and the setup and hold adjust select 70 can be implemented in the reverse order from what is shown here, or combined into one operation. In the latter case, the setup and hold adjustment factor is added to the bin number and the shift/selection is determined by the resulting number. However, that approach requires circuitry and time to perform the addition and does not permit glitch detection and setup and hold violation checking to be performed on the intermediate result, as is done in the implementation shown in FIG. 1. The combined shifter has to be larger than either of the two separate ones, but will be smaller than their sum.

The discussion above has focused on synchronous acquisition, in which the user's signals are detected and selected to become a virtual clock edge and determine a bin number. To use the same circuitry for asynchronous operation, the clock edge detection and selection circuitry 50 can be made to produce a bin number of "000" and a constantly high VALID DATA signal when asynchronous operation is selected. A constant bin number of "000" then causes the sample select shifter 60 to always take the TPH0 bit as the reference bit for its output, and the constantly high VALID DATA signal causes the rest of the downstream circuitry to process one sample for every system clock. This produces an equivalent result to normal asynchronous operation in a conventional logic analyzer. And, by making the VALID DATA signal periodic, the asynchronous data can be further decimated to provide reduced-rate asynchronous acquisitions.

In the description given above, some timing details and logic pipelining which may be needed to avoid race conditions have been omitted for simplicity, but such techniques are well known to those skilled in the design of digital circuitry.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true scope and spirit of the invention.

We claim:

1. A logic analyzer having digital data acquisition means, an acquisition memory, and means for displaying binary digital data representations of acquired data, wherein the digital data acquisition means comprises:

high-speed sampling means (10) for asynchronously acquiring a plurality of parallel relatively high-speed data samples within each cycle of an internal clock (95), the plurality of parallel relatively high-speed data samples containing information about the sequential behavior of an input signal during a period of the internal clock;

means (20–70) for selecting one of the plurality of parallel relatively high-speed data samples as a selected relatively low-speed data sample for storage in the acquisition memory.

2. A logic analyzer according to claim 1 wherein the selecting means comprises a skew adjustment delay means (20) for receiving the plurality of parallel relatively high-speed data samples and producing time-aligned parallel relatively high-speed data samples.

3. A logic analyzer according to claim 2 wherein the selecting means further comprises a high-speed memory (30) for storing time-aligned parallel relatively high-speed data samples.

4. A logic analyzer according to claim 1 wherein the selecting means comprises:

means for clock edge detection (50) for monitoring the time-aligned parallel relatively high-speed data samples and producing a bin number signal to identify one of the plurality of parallel relatively high-speed samples as the single internal relatively low-speed data sample; and means for reference sample selection (60) for receiving the plurality of parallel relatively high-speed samples and the bin number signal and producing a set of parallel samples with a reference sample at a predetermined position within the set.

5. A logic analyzer according to claim 4 wherein the bin number signal is combined with a coarse timestamp value to produce a fine timestamp value.

6. A logic analyzer according to claim 4 wherein the selecting means comprises a setup and hold adjustment selection means (70) for receiving the set of parallel samples with the reference sample at the predetermined position and producing the selected relatively low-speed data sample according to setup and hold adjustment data.

7. A logic analyzer according to claim 1 wherein the selecting means comprises a setup and hold adjustment selection means (70) for receiving parallel samples derived from the plurality of parallel relatively high-speed data samples and producing the selected relatively low-speed data sample according to setup and hold adjustment data.

8. A logic analyzer according to claim 2 wherein the selecting means comprises a setup and hold adjustment selection means (70) for receiving the time-aligned parallel relatively high-speed data samples and producing the selected relatively low-speed data sample according to setup and hold adjustment data.

9. A logic analyzer according to claim 4 further comprising means for glitch detection (200) for receiving the set of parallel samples with the reference sample at the predetermined position and producing a glitch signal according to the content of the set of parallel samples.

10. A logic analyzer according to claim 9 wherein the glitch detection means comprises:

means for determining (201–216, 218, 220) when the set of parallel samples contains indications of rising or falling transitions in the input signal; and means for ascertaining (224–230) which indications of rising or falling transitions correspond to normal transitions and which correspond to glitches and producing a glitch signal when the latter occur.

11. A logic analyzer according to claim 4 further comprising means for setup and hold violation checking (100)

for receiving setup and hold window mask information and the set of parallel samples with the reference sample at the predetermined position and producing a setup and hold violation signal when the set of parallel samples indicate the occurrence of a transition in the input signal during the interval represented by the setup and hold window mask.

12. A glitch detector comprising:

means for presenting (60) in parallel a series of data samples representative of logic states of an input signal over an interval of time;

means for detecting (201–216) rising or falling state transitions in the series of data samples presented in parallel and producing a rising transition signal when a rising transition is detected and a falling transition signal when a falling transition is detected; and means for ascertaining (224–230) which detected rising or falling state transitions correspond to glitches and producing a glitch signal output when the such transitions occur.

13. A glitch detector according to claim 12 wherein the means for ascertaining comprises:

a first flip-flop (230) containing a glitch bit and producing the glitch signal output according to a transition signal input upon the occurrence of a system clock signal;

a second flip-flop (226) responsive to a valid data signal input;

a first multiplexer (222) having a first input coupled to receive the rising transition signal and a second input coupled to receive the falling transition signal and producing a transition signal output corresponding to either the rising transition signal or the falling transition signal depending on the state of the second flip-flop.

14. A glitch detector according to claim 13 further comprising:

a second multiplexer (228) having first input for receiving an ORed signal and a second input for receiving a transition signal and producing as an output either the transition signal or the ORed signal depending on the state of a valid data signal, the ORed signal input being the output of the first flip-flop ORed with the transition signal input.

15. A glitch detector according to claim 13 further comprising:

a second multiplexer (224) having as one input the output of the second flip-flop and as a another input a most recent data sample from the series of data samples, and producing as an output to the input of the second flip-flop a signal corresponding to either the output of the second flip-flop or the most recent data sample depending on the state of the valid data signal.

16. A setup and hold violation checker comprising:

means for presenting (60) in parallel a series of data samples representative of logic states of an input signal over an interval of time;

means for detecting (102) non-equality of adjacent data samples in the series of data samples presented in parallel and producing a change bit associated with the location of such a non-equality when such a non-equality is detected; and means for selectively enabling (104) change bits according to the content of a set of setup and hold window mask signals; and means for ORing (106) enabled change bits to produce a setup and hold violation signal.

17. A setup and hold violation checker according to claim 16 further comprising second ORing means (108) for combining a plurality of setup and hold violation signals to produce a multiple channel setup and hold violation signal.

* * * * *